United States Patent [19]

Miko

[11] 4,334,267
[45] Jun. 8, 1982

[54] FREE-RUNNING PUSH-PULL INVERTER

[75] Inventor: Sandor Miko, Indianapolis, Ind.

[73] Assignee: RCA Corporation, New York, N.Y.

[21] Appl. No.: 198,419

[22] Filed: Oct. 20, 1980

[51] Int. Cl.³ ............................................ H02M 7/537
[52] U.S. Cl. ............................... 363/133; 331/113 A;
363/22; 363/56
[58] Field of Search ...................... 363/22, 56, 97, 133;
331/113 A

[56] References Cited

U.S. PATENT DOCUMENTS

| | | | |
|---|---|---|---|
| 3,256,495 | 6/1966 | Hunter | 331/113 A |
| 3,350,661 | 10/1967 | Bloom et al. | 331/113 A |
| 3,361,952 | 1/1968 | Bishop | |
| 3,434,036 | 3/1969 | Phillips | |
| 3,448,370 | 6/1969 | Harrigan | 363/133 |
| 4,047,089 | 9/1977 | Suzuki et al. | 363/22 |

FOREIGN PATENT DOCUMENTS 54-147418  11/1979  Japan ....................................... 363/22

OTHER PUBLICATIONS

"Semiconductor Power Circuits Handbook", Chapter 2, Motorola, Inc., 1968.

Primary Examiner—William H. Beha, Jr.
Attorney, Agent, or Firm—Eugene M. Whitacre; Paul J. Rasmussen; Joseph Laks

[57] ABSTRACT

A power transformer of an inverter power supply has a primary winding coupled to a source of DC voltage. First and second transistor switches are coupled to the primary winding in a push-pull arrangement. A drive winding of a saturable transformer is coupled to the base electrode of each of the two transistor switches to alternately apply forward drive to each switch. A control winding of the saturable transformer is supplied with a control current that reaches a magnitude that magnetically saturates the core of the saturable transformer to remove forward drive from the conducting transistor switch for developing an alternating polarity output voltage across a supply winding of the power transformer. A capacitor and an inductor form a resonant circuit upon attainment of core saturation. The voltage across the capacitor then commences a resonant oscillation, with the frequency of oscillation sufficiently low to supply a magnetizing current to the drive winding that maintains the core in saturation beyond the cessation of forward collector current in the conducting transistor switch and before forward collector current begins to flow in the other transistor switch.

6 Claims, 3 Drawing Figures

FREE-RUNNING PUSH-PULL INVERTER

This invention relates to push-pull inverter power supplies.

Switching power supplies provide relatively lightweight and compact power supply units when operated at the relatively high frequencies of 20 KHz or greater and provide relatively good efficiency of operation. One type of switching power supply is a push-pull inverter power supply wherein a DC voltage source is coupled to the center tap of a power transformer primary winding and the collector electrodes of two switching transistors are coupled to the respective end terminals of the primary winding. A control circuit alternately turns on each of the two transistor switches to develop an alternating polarity output voltage across a supply winding of the power transformer.

One type of push-pull inverter is a free-running inverter having a saturable transformer control circuit. Collector current feedback from the switching transistors to the saturable transformer generates the required switching action. A free-running inverter with current feedback to a separate saturable transformer control circuit is a reliable arrangement which insures free-running inverter operation with heavy load current draw. Operation is insured even during the start-up interval when a relatively large load current must be supplied to charge rectifier filter capacitors.

In the operation of a saturable transformer current feedback push-pull inverter, a drive winding of the saturable transformer is coupled to the base electrodes of the two inverter transistor switches. Two saturable transformer control windings are provided, each control winding being coupled in the series path of the collector current flowing in a respective transistor switch. When a transistor switch is conducting, the collector current flowing through the respective saturable transformer control winding generates a forward biasing voltage for the switch across the saturable transformer drive winding. Eventually, the magnetizing current component of the current flowing in the control winding builds up the magnetic flux in the core of the saturable transformer to a level great enough to magnetically saturate the core. Once the core is saturated, forward drive to the conducting transistor switch is removed, and the switch's collector current begins to fall.

The falling collector current eventually brings the core out of magnetic saturation and induces an opposite polarity voltage across the saturable transformer drive winding. The opposite polarity induced voltage turns on the other transistor switch when the voltage has increased in magnitude above the forward base-emitter conduction threshold voltage of the other switch. Collector current of the other switch flows through the respective saturable transformer control winding to generate the forward drive voltage across the drive winding that is needed to maintain the other switch conducting after the first switch's collector current has decreased to zero.

Because the falling collector current of the first transistor switch initially generates the opposite polarity forward drive voltage for the other transistor switch, an interval exists when the two transistor switches simultaneously conduct collector current. Such simultaneous conduction is undesirable in a push-pull inverter arrangement because it, in effect, results in the momentary short-circuiting of the power transformer primary winding across the DC voltage source during the overlapping, simultaneous conduction interval. Relatively large power dissipation in both transistors may occur as spikes of collector current are developed during this overlapping interval. The current spikes also may produce an undesirable amount of radio frequency radiation.

Simultaneous conduction of both switching transistors may be reduced in duration by the use of relatively fast switching transistors and by the use of a relatively square-loop magnetizable material for the core of the saturable transformer. Nonetheless, it is relatively difficult, even with the use of fast switching transistors and square-loop core material, to eliminate simultaneous conduction.

It is known in voltage feedback, saturable transformer, push-pull inverters to use RC integrating networks between the saturable transformer drive winding and the two inverter transistor bases. Such circuits require either an excessively large initial current flow to insure the elimination of cross-conduction or only minimize it without eliminating it entirely. It is also known in voltage feedback, saturable transformer, push-pull inverter circuits to connect a capacitor alone to the control winding of the saturable transformer as an aid to core saturation. However, since the air-core or saturated inductance of the control winding is so low, the capacitor current by itself is insufficient to insure the development of a significant inverter dead-time.

A feature of the invention is the design of a saturable transformer push-pull inverter power supply which eliminates the simultaneous forward collector current conduction of both switching transistors without the need for fast switching transistors or relatively expensive square-loop saturable transformer core materials. A power transformer primary winding is coupled to a source of DC voltage. First and second transistor switches are coupled to the primary winding in a push-pull arrangement. A drive winding of a saturable transformer is coupled to a control electrode of each transistor switch to alternately apply forward drive to each switch. A saturable transformer control winding is supplied with a control current that reaches a magnitude that magnetically saturates the core of the saturable transformer to remove forward drive from each transistor switch to develop an alternating polarity output voltage across a supply winding of the power transformer. A resonant circuit including a capacitance is coupled to the saturable transformer drive winding. The voltage across the capacitance commences a resonant oscillation upon the attainment of core saturation. The frequency of the resonant oscillation is sufficiently low so as to enable the capacitance to supply said drive winding with a magnetizing current that maintains saturation of the core beyond cessation of forward collector current in the conducting transistor switch before forward collector current begins to flow in the other transistor switch.

In a specific embodiment of the invention, the saturable transformer control winding is coupled in the series path of the collector currents of the two transistor switches. The collector current builds up magnetic flux in the core of the saturable transformer to eventually magnetically saturate the core and initiate the flow of the aforementioned resonant current.

In a further specific embodiment, the resonant circuit includes an inductance series coupled with the capacitance across the drive winding. When the voltage across the saturable transformer drive winding is removed due to core saturation, the current in the inductance and in the capacitance oscillates to produce the magnetizing current that flows through the saturable transformer drive winding. The values of the capacitance and inductance are selected to provide a sufficient current flow in the saturable transformer drive winding to maintain the saturable transformer core in magnetic saturation throughout the fall time of the collector current in the transistor switch that is being turned off.

Figure 1:
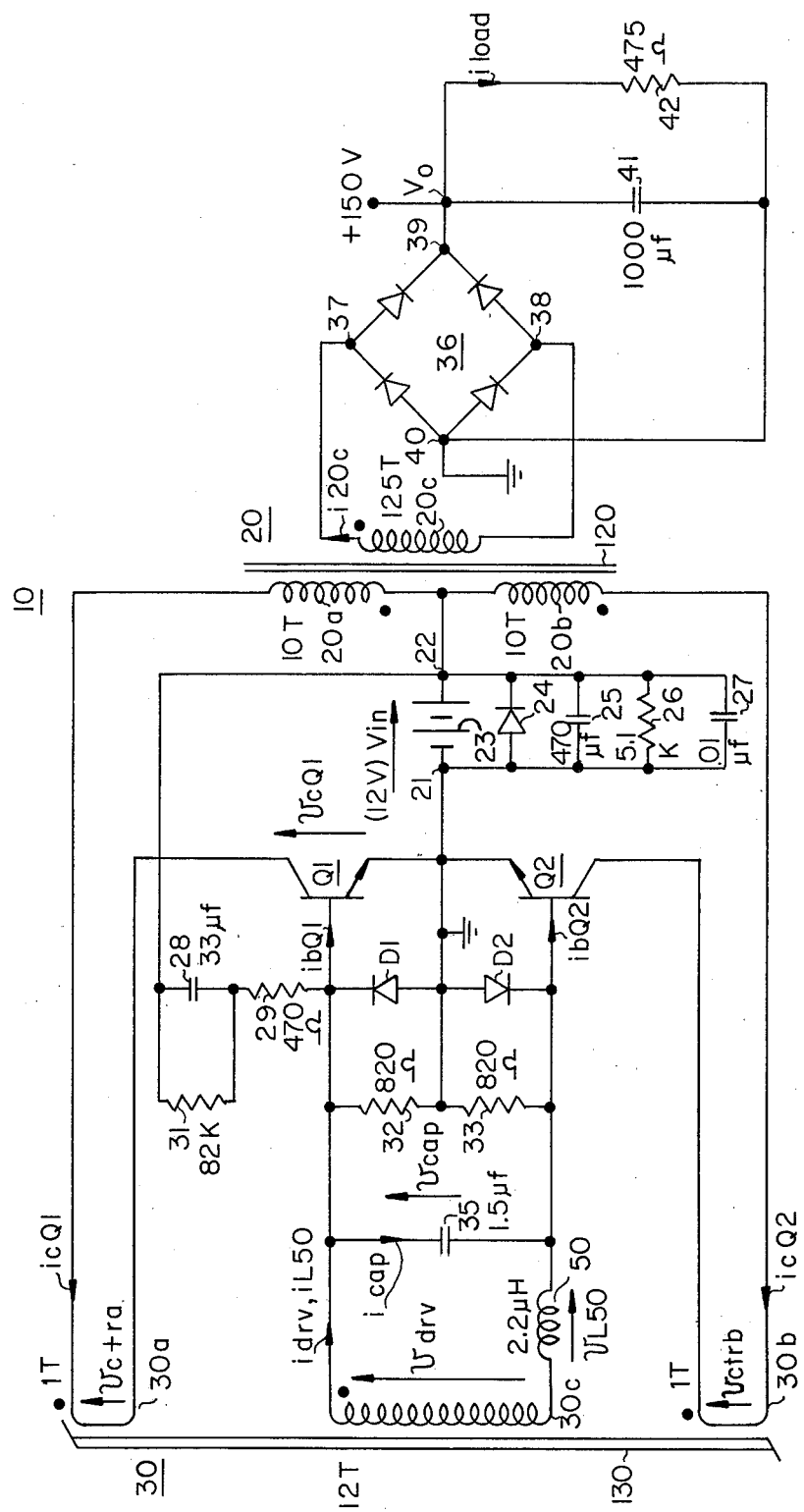
FIG. 1 illustrates a push-pull inverter power supply embodying the invention.

In the push-pull inverter power supply 10 of FIG. 1, a source 23 of DC voltage $V_{in}$, illustratively a 12-volt battery, is coupled between an input terminal 22 and a ground or current return terminal 21. Input terminal 22 is coupled to the center tap of a primary winding of a power transformer 20. The primary winding of power transformer 20 comprises two winding sections 20a and 20b, each having an end terminal coupled to input terminal 22 at the center tap termination. A secondary or output supply winding 20c of power transformer 20 is coupled to input terminals 37 and 38 of a full-wave bridge rectifier 36. A filter capacitor 41 is coupled between an output terminal 39 of bridge rectifier 36 and a current return terminal 40 that is coupled to ground. Supply winding 20c and primary winding sections 20a and 20b are magnetically tightly coupled to one another. A stepped-up alternating polarity output voltage developed across supply winding 20c is full-wave rectified by bridge rectifier 36 to provide a DC supply voltage $V_0$, of illustratively +150 volts, at terminal 39 for a load 42 coupled across a filter capacitor 41.

The end terminal of power transformer primary winding section 20a that is remote from the center tap terminal is coupled to the collector of a transistor switch Q1 through a control winding 30a of a saturable transformer 30. The end terminal of power transformer primary winding section 20b that is remote from the center tap terminal is coupled to the collector of a transistor switch Q2 through a control winding 30b of saturable transformer 30. The emitter electrodes of transistors Q1 and Q2 are coupled to ground. One end terminal of a drive winding 30c of saturable transformer 30 is coupled to the base or control electrode of transistor switch Q1 and the other end terminal of drive winding 30c is coupled to the base or control electrode of transistor switch Q2 through an inductor 50. Control windings 30a and 30b and drive winding 30c are magnetically tightly coupled to one another. A capacitor 35 is series coupled with inductor 50 across saturable transformer drive winding 30c with the base of transistor Q1 coupled to the junction of capacitor 35 and winding 30c and with the base of transistor Q2 coupled to the junction of capacitor 35 and inductor 50. A diode D1 has its cathode coupled to the base of transistor Q1 and its anode coupled to ground. Similarly coupled between the base of transistor Q2 and ground is a diode D2.

Transistor switches Q1 and Q2 are coupled to the primary winding sections of power transformer 20 in a push-pull arrangement. The drive winding 30c of saturable transformer 30 applies forward drive alternately to each of the two transistor switches Q1 and Q2. Current feedback from the collectors of the two transistor switches Q1 and Q2 supplies a control current to the two control windings 30a and 30b that magnetically saturates the core 130 of saturable transformer 30 to alternately remove forward drive from the transistor switches, thereby initiating the switching action that develops the alternating polarity output voltage across the power transformer supply winding 20c. The current feedback from the collectors of transistors Q1 and Q2 enables push-pull inverter 10 to operate in a free-running mode, dispensing with the need for a separate oscillator and for additional control circuitry associated therewith.

Operation of free-running push-pull inverter power supply 10 will now be described with the aid of the waveforms and curves of FIGS. 2A–2I and 3A–3F. Assume transistor switch Q1 is in saturated conduction beginning at time $t_0$ of FIGS. 2A–2I. With transistor Q1 conducting, the input voltage $V_{in}$ is applied across the series arrangement of power transformer primary winding section 20a and saturable transformer control winding 30a, with almost all of the input voltage $V_{in}$ being applies across power transformer primary winding section 20a. By transformer action the voltage developed across power transformer supply winding 20c substantially equals the input voltage $v_{in}$ multiplied by the secondary-to-primary section turns ratio of the power transformer 20.

Figure 2:
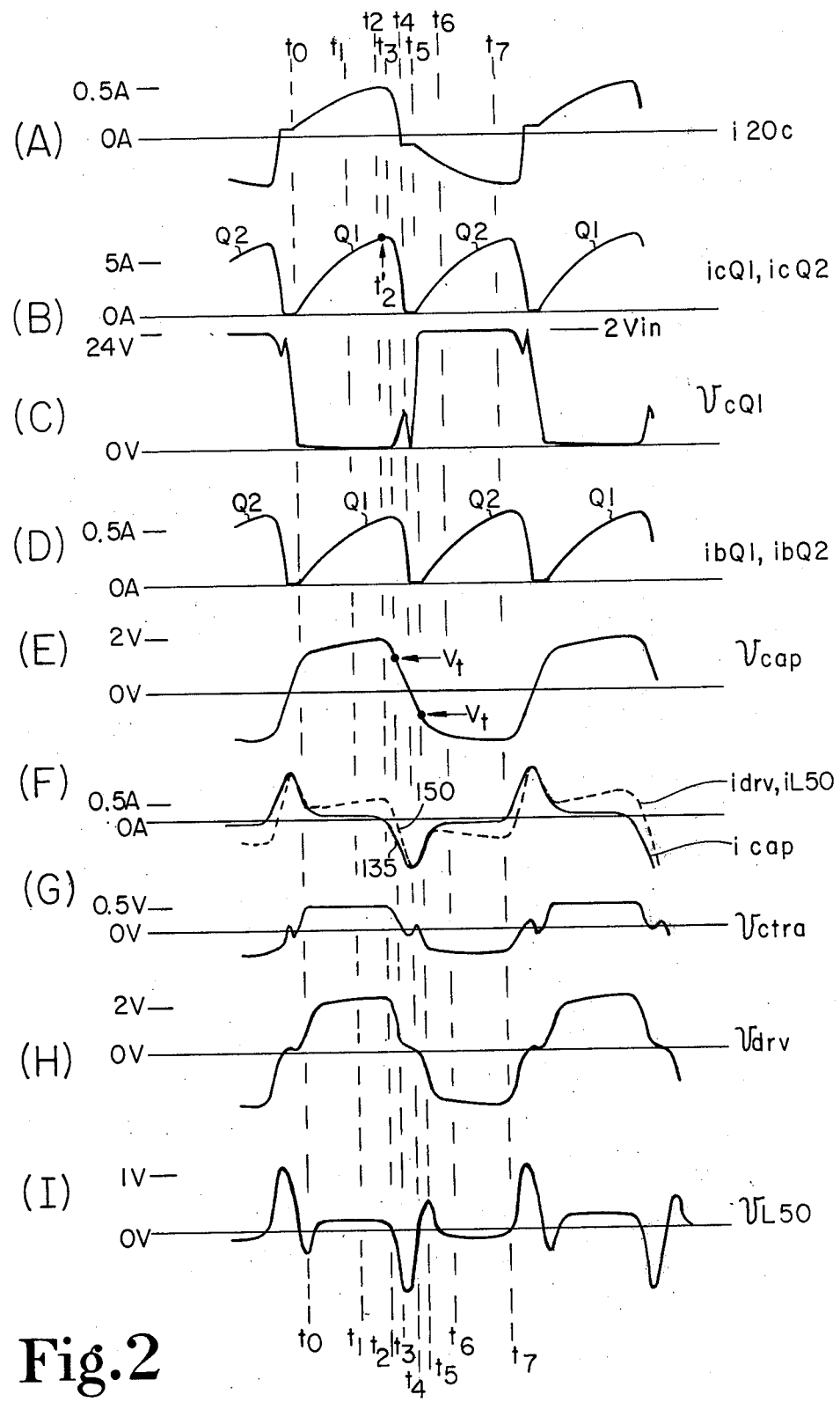
FIGS. 2A–2I and FIGS. 3A–3F illustrate waveforms and curves associated with the circuit of FIG. 1.

A secondary winding current $i_{20c}$ flows from supply winding 20 to filter capacitor 41 and load 42 through bridge rectifier 36. The current $i_{20c}$ is illustrated in FIG. 2A. The waveshape of the supply winding current $i_{20c}$ is a function of the complex impedance exhibited by filter capacitor 41 and load 42 and the source impedance associated with supply winding 20c. With primary winding section 20a and supply winding 20c being magnetically tightly coupled to each other, the collector current $i_{cQ1}$ of transistor Q1 is generally of the same waveshape as the supply winding current $i_{20c}$, stepped up in amplitude by the turns ratio of power transformer 20.

With the input voltage $V_{in}$ being applied to primary winding section 20a, the collector current $i_{cQ1}$ also includes a magnetizing current component that develops a time varying magnetic flux in the power transformer core 120 for inducing the output voltage across supply winding 20c. The magnetizing component of the current flowing in primary winding section 20a is of relatively small magnitude, substantially less than 1/10th the transformer load current magnitude, for example, and thus the waveshape of the collector current $i_{cQ1}$ is substantially that of the supply winding current $i_{20c}$.

With transistor Q1 in saturated conduction after time $t_0$, a portion of the input voltage $V_{in}$ is applied across saturable transformer control winding 30a as illustrated by the voltage $v_{ctra}$ of FIG. 2G between times $t_0$–$t_2$. The voltage applied across saturable transformer control winding 30a between times $t_0$–$t_2$ has associated therewith a magnetizing component to the collector current $i_{cQ1}$ flowing in control winding 30a. The magnetizing current component of the current flowing in control winding 30a, like the magnetizing current component flowing in power transformer primary winding section 20a, is of relatively small magnitude compared to the total collector current $i_{cQ1}$ flowing in the saturable transformer control winding.

Because saturable transformer control winding 30a is magnetically tightly coupled to saturable transformer drive winding 30c, the voltage $v_{drv}$ developed across drive winding 30c substantially equals the transformed voltage of the voltage applied across control winding 30a, as illustrated in FIGS. 2G and 2H between times $t_0$–$t_2$, and the current $i_{drv}$ flowing in drive winding 30c substantially equals the transformed current of the current $i_{cQ1}$ flowing in control winding 30a, as illustrated in FIG. 2B and the dashed-line waveform of FIG. 2F. The current $i_{drv}$ flowing in drive winding 30c also flows as the current $i_{L50}$ in inductor 50.

With the voltage across drive winding 30c positive at the dotted terminal after time $t_0$ of FIG. 2H, a forward biasing or forward drive voltage is applied to the base of transistor Q1 to maintain the transistor in saturated conduction. A forward drive current flows from drive winding 30c to the base of transistor Q1 as illustrated by the base current $i_{bQ1}$ of FIG. 2D between times $t_0$–$t_2$. The circuit path for transistor Q1 base current begins, for example, at the dotted terminal of control winding 30c, through the base and emitter electrodes of transistor Q1 in the forward direction, through diode D2 and inductor 50 to the undotted terminal of drive winding 30c.

The base-emitter junction of transistor Q1 and the pn junction of diode D2 present a relatively low impedance load coupled to drive winding 30c. Saturable transformer 30 functions as a current transformer, with the current in drive winding 30c being substantially equal to the transformation of the collector current $i_{cQ1}$ flowing in control winding 30a, as illustrated by the similar waveshape between times $t_0$–$t_2$ to the currents $i_{cQ1}$ of FIG. 2B and $i_{bQ1}$ of FIG. 2D. The turns ratio of drive winding 30c to control winding 30a is such as to provide a sufficiently large base current $i_{bQ1}$ relative to the collector current $i_{cQ1}$ to maintain transistor Q1 in saturated conduction after time $t_0$. The voltage developed across drive winding 30c between times $t_0$–$t_2$ is essentially that of the forward voltage drops of the base-emitter junction of transistor Q1 and the pn junction of diode D2.

The magnetizing component of the collector current $i_{cQ1}$ flowing in saturable transformer control winding 30a after time $t_0$ develops a magnetizing force field H in the core 130 of saturable transformer 30. The magnetizing force field produced by the magnetizing current flowing in control winding 30a in turn develops a magnetic flux in core 130 which links control winding 30a and drive winding 30c such that the time rate of change of the magnetic flux linking control winding 30a is proportional to that part of the input voltage $V_{in}$ applied across the control winding. Furthermore, the time rate of change of the magnetic flux in core 130 linking drive winding 30c induces across the drive winding the forward biasing voltage for transistor Q1 between times $t_0$–$t_2$, as illustrated in FIG. 2H. The remainder of the collector current $i_{cQ1}$ essentially is associated with the reflected load current $i_{drv}$ flowing to the base of transistor Q1 and does not substantially contribute to the generation of any magnetic flux in the saturable transformer core.

With a relatively constant voltage being applied across control winding 30a after time $t_0$ of FIG. 2G, the magnetic flux and the magnetic flux density B in core 130 of saturable transformer 30 increases with time in accordance with the time integral of the voltage applied across the control winding. The magnetizing current and thus the corresponding magnetizing force H required to obtain a particular flux density in the core 130 is determined by the location of the core operating point on the B-H hysteresis loop associated with the magnetizable material of the core.

FIGS. 3A–3F illustrate idealized hysteresis loops of a saturable core transformer formed from a ferrite material. At an illustrative instant $t_1$ of FIG. 2G, the magnetizable core 130 of saturable transformer 30 is not yet magnetically saturated. The applied voltage across control winding 30a has caused the flux density B in the core to increase to the value $B_a$, locating the operating point of the transformer core at point a on the B-H hysteresis loop of FIG. 3A. The magnetizing force H required to locate the transformer operating point at point a equals $H_a$. The magnetizing force $H_a$ is produced by the magnetizing component of the collector current $i_{cQ1}$.

Point a is located in the unsaturated region of the B-H hysteresis loop. Thus, as the operating point of the transformer travels up the hysteresis loop curve in the direction of the arrow of FIG. 3A with the elapse of time beyond time $t_1$, the flux density B in core 130 also increases in time, enabling a forward drive voltage for transistor Q1 to be induced across drive winding 30c, as illustrated in FIG. 2H by the voltage $v_{drv}$ after time $t_1$.

Figure 3:
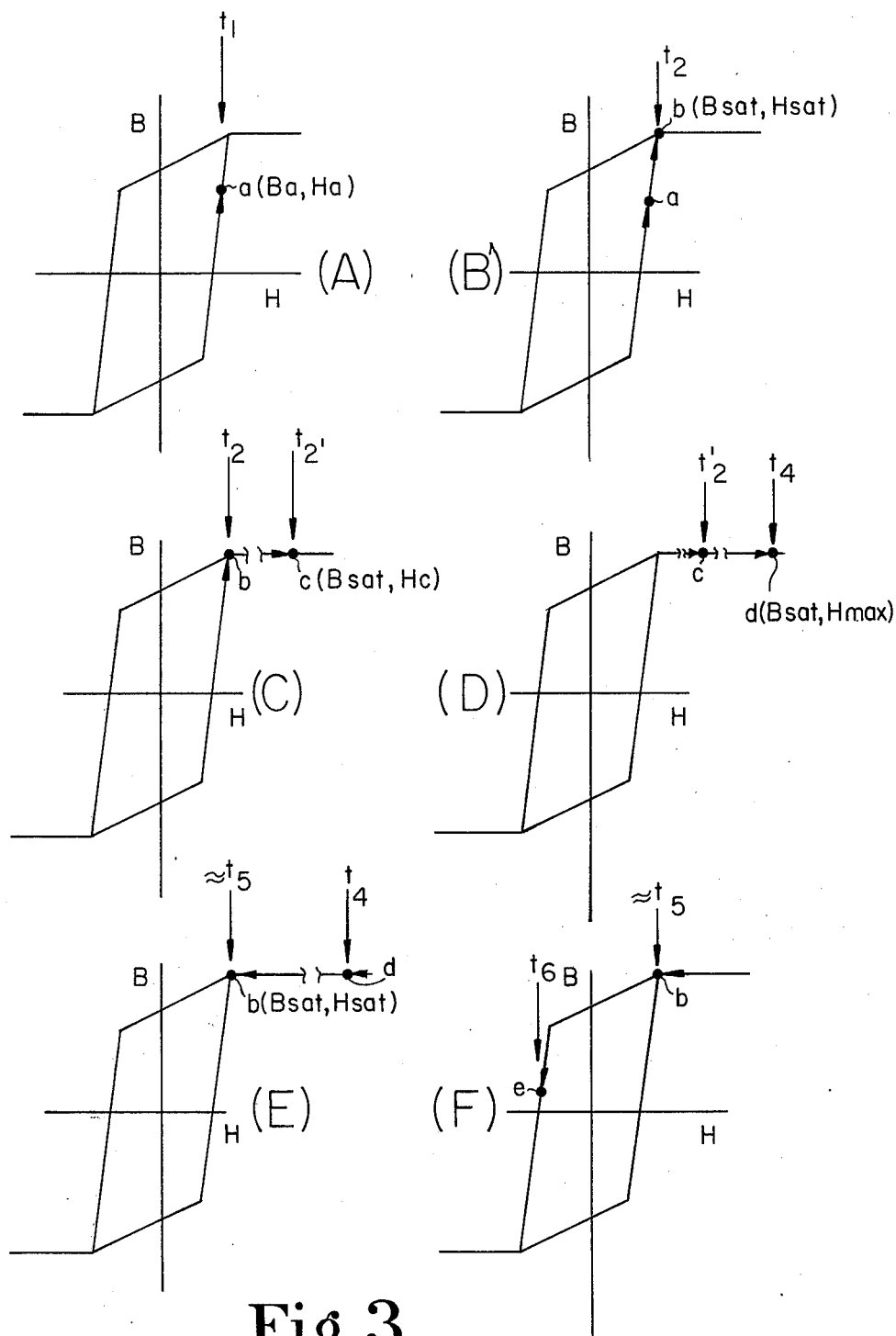

At time $t_2$, the flux buildup in core 130 has progressed to where the transformer core operating point is located at point b on the B-H hysteresis loop of FIG. 3B. Point b on the idealized hysteresis loop of FIG. 3B is the point beyond which the core enters into the magnetically saturated region of the B-H hysteresis loop. Thus, the flux density of the core at point b is equal to $B_{sat}$, the maximum or saturation flux density obtainable in the core. The magnetizing force required to obtain the saturation flux density $B_{sat}$ is the force $H_{sat}$. Any further increase in magnetizing force beyond $H_{sat}$ will locate the operating point of the transformer core farther in the saturation region but will provide no further increase in flux density.

Because the flux density in the core cannot change substantially when the transformer is operated in the magnetic saturation region of the B-H hysteresis loop, the voltages developed across saturable transformer control winding 30a and drive winding 30c begin to decrease rapidly and remain near zero from time $t_2$ when the core 130 enters the saturated region of operation until around time $t_5$ when the core again becomes unsaturated and reenters the magnetically unsaturated region of the B-H hysteresis loop.

Before the core 130 becomes magnetically saturated, before time $t_2$, the voltage across capacitor 35 is maintained by drive winding 30c at the induced drive winding voltage $v_{drv}$ of FIG. 2H, less the relatively small voltage drop $v_{L50}$ of inductor 50 of FIG. 2I. After time $t_2$, capacitor 35 and inductor 50 form a resonant circuit and begin to undergo a resonant current oscillation, as indicated in FIG. 2F by the resonant current portion 135 of the solid-line capacitor current waveform $i_{cap}$. The voltage $v_{cap}$ across capacitor 35 is illustrated in FIG. 2E and begins to decrease after time $t_2$ in a resonant manner.

The forward conduction path for transistor Q1 base current is from the base electrode of transistor Q1 through the base-emitter junction of the transistor in the forward direction to ground and then through the pn junction in the forward direction of diode D2 to the cathode electrode of the diode. Capacitor 35 is therefore coupled across the series arrangement of the base-emitter electrodes of transistor Q1 and diode D2. Thus, forward base current for transistor Q1 is supplied by capacitor 35 after core 130 becomes magnetically saturated. As illustrated in FIGS. 2B–2D, transistor Q1 remains in saturated conduction between times $t_2$–$t_3$, as indicated by the substantially zero collector voltage $v_{cQ1}$. The forward base current for transistor Q1 during this interval is being supplied by the resonant portion 135 of the capacitor current $i_{cap}$ of FIG. 2F.

Near time $t_3$, the resonant current oscillation in capacitor 35 has resulted in a decrease in the voltage $v_{cap}$ across the capacitor to below the threshold voltage level $V_t$ of FIG. 2E. Below this threshold voltage level, the voltage applied to the base of Q1 is insufficient to maintain the transistor forward biased. Thus, after time $t_3$, the base current $i_{bQ1}$ of FIG. 2D and the collector current $i_{cQ1}$ of FIG. 2B decrease relatively rapidly until transistor Q1 becomes cut off at time $t_4$, beyond which time no forward collector current flows in the transistor.

Between times $t_2$–$t_3$ when transistor Q1 is in saturated conduction due to the forward base current drive being supplied by capacitor 35, the magnetizing component of the collector current is still maintaining the operating point of core 130 in the magnetic saturation region. As illustrated in FIGS. 2B and 3C, at an illustrative instant $t'_2$, intermediate of times $t_2$ and $t_3$, the magnetizing current portion of the collector current $i_{cQ1}$ has located the operating point of the transformer core at a point c, farther into the saturated region of the B-H loop due to the application of a magnetizing force $H_c$ greater than $H_{sat}$. The flux density value at point c is, however, still at the $B_{sat}$ value.

During the fall time of the collector current $i_{cQ1}$, between times $t_3$–$t_4$ of FIG. 2B, the magnetizing current for core 130 that flows in control winding 30a and that contributes to generating the magnetizing force field H in the core also decreases relatively rapidly. Without capacitor 35, only the magnetizing current flowing in control winding 30a would be contributing to the magnetizing force field. At some instant between times $t_3$ and $t_4$, the magnetizing current would have decreased in magnitude sufficiently to bring the core out of saturation and into the nonsaturated region of the B-N hysteresis loop. The decreasing magnetizing current and thus the decreasing magnetizing force, after this instant, would have induced an opposite polarity voltage in drive winding 30c which would have turned on the other transistor switch Q2. Thus, there would have been an overlapping interval during which both transistors would have been conducting collector current. This overlapping interval can be minimized by a more rapid fall time of the collector current of the transistor switch that is being turned off or by selecting a core material which is more square in hysteresis loop characteristic. However, it would be relatively difficult to eliminate the overlapping conduction interval.

A feature of the invention is the elimination of the simultaneous forward collector current conduction of transistor switches Q1 and Q2. By coupling capacitor 35 to drive winding 30c of saturable transformer 30, an additional source of magnetizing current for the core 130 is now made available by the capacitor to take over the generation of the magnetizing force field in the core during and subsequent to the interval $t_3$–$t_4$, the interval $t_3$–$t_4$ being the fall time interval of the collector current in transistor switch Q1.

As illustrated in FIG. 2F, after time $t_2$, the drive winding current $i_{drv}$, the dashed-line waveform, is basically a resonant current 150 obtained from the resonant current portion 135 of the capacitor current $i_{cap}$. During the interval $t_3$–$t_4$, the current $i_{drv}$ is increasing and is negative, indicating that the current flows into the dotted terminal of the drive winding 30c.

Because the core 130 is in magnetic saturation at time $t_3$, substantially all the current $i_{drv}$ flowing into the dotted terminal comprises a magnetizing current that maintains the core in the magnetically saturated region of the B-H hysteresis loop. The values of capacitor 35 and of inductor 50 are selected to provide a sufficient resonant, magnetizing drive winding current 150 to maintain core 130 in magnetic saturation despite the loss of magnetizing current flowing in control winding 30a. The operating point of the transformer core between times $t_3$–$t_4$, instead of reversing its direction of travel and returning to the unsaturated region of the B-H loop, continues outward into the saturated region. At time $t_4$ the operating point reaches its maximum excursion at point d of FIG. 3D at an H value equal to $H_{max}$ that corresponds to the maximum excursion at time $t_4$ of the resonant magnetizing current portion 150 of the drive winding current $i_{drv}$. The current $i_{drv}$ additionally must provide base current to transistor Q1 during the fall time $t_3$–$t_4$ of the base current $i_{bQ1}$ of FIG. 2D.

Between times $t_4$–$t_5$, the resonant current oscillation of the capacitor current $i_{cap}$ continues, with the voltage across capacitor 35 being reversed in polarity and increasing in magnitude. Prior to time $t_5$, however, the voltage is insufficient to forward bias the other transistor switch, transistor Q2. As illustrated by FIGS. 2B and 2D, a dead-time or nonconduction interval $t_4$–$t_5$ exists, during which no forward base current $i_{bQ1}$ or $i_{bQ2}$ flows in the transistor switches.

Near time $t_5$, the voltage $v_{cap}$ has increased in magnitude above the threshold voltage level $V_t$, turning on the other transistor switch Q2 into saturated conduction as illustrated by the waveforms of FIGS. 2B–2D. The values of capacitor 35 and inductor 50 are such as to provide a sufficiently low resonant oscillation frequency of the capacitor voltage and current so as to enable the capacitor to supply drive winding 30c with a magnetizing current that maintains core 130 in magnetic saturation beyond the cessation of forward collector current in transistor Q1 before forward collector current begins to flow in transistor Q2. A substantial dead time $t_4$–$t_5$ exists to prevent cross-conduction of the two transistor switches.

In the absence of base current flowing in either transistor switch after time $t_4$, the resonant current portion 150 of the drive winding current $i_{drv}$ substantially equals the resonant current portion 135 of the capacitor current $i_{cap}$. After time $t_4$ the resonant drive winding current is decreasing in magnitude, though still flowing into the dotted terminal of drive winding 30c. Since the resonant drive winding current comprises the magnetizing current for the core 130 that is generating the saturation producing magnetizing force for the core, the decreasing drive winding current after time $t_4$ is moving the operating point of the transformer core from its maximum excursion point d in the saturated region of the B-H hysteresis loop of FIG. 3E back to point b, the beginning point of the nonsaturated region of the hysteresis loop when the loop is being traversed in the opposite direction.

By time $t_5$, the instant when transistor switch Q2 is turned on when the voltage across capacitor 35 has increased above the threshold voltage level $V_t$, the operating point of the saturable transformer core 130 has returned to near point b or even slightly beyond point b into the nonsaturated region of the B–H hysteresis loop. Regardless of the exact location of the operating point of the core at time $t_5$, when collector current begins to flow in transistor Q2, the core operating point quickly moves into the nonsaturated region of the B–H hysteresis loop to point e, for example, of FIG. 3F at time $t_6$, for example, of FIGS. 2E–2H. The direction of travel of the core 130 operating point between point b and point e between times $t_5$–$t_6$ is such as to induce an opposite polarity voltage across drive winding 30c.

After time $t_5$ with core 130 again in the nonsaturated region of operation, the induced voltage across drive winding 30c stops the resonant current oscillation in capacitor 35. Drive winding 30c begins to supply the forward base current for transistor switch Q2, taking over the current supplying function from capacitor 35. The magnetizing current for the core 130 now is being supplied by the collector current $i_{cQ2}$ flowing in control winding 30b in a manner similar to that previously described with respect to collector current flowing in control winding 30a during the aforementioned half cycle of inverter operation. The sequence of events occurring during the half cycle of inverter operation of transistor switch Q2 is substantially the same sequence associated with inverter operation of transistor switch Q1.

The air-core inductance of drive winding 30c is much lower, ten or more times lower, than the inductance of inductor 50. In conjuction with capacitance of capacitor 35, it is the inductance of inductor 50, rather than that of winding 30c that determines the resonant oscillation frequency of the voltage across capacitor 35 and the magnetizing current portion 150 of FIG. 2F. The peak magnetizing current at time $t_4$ can therefore be carefully controlled to insure that no more than the minimum necessary to keep core 130 in magnetic saturation is being provided. No excessive magnitude capacitor current need be generated. Furthermore, the resonant frequency can also be carefully controlled to provide as much dead-time $t_4$–$t_5$ as is needed, with a wide range of dead-times being selectable by proper choice of inductor 50 and capacitor 35.

During the dead-time or the overlapping nonconduction interval of forward collector current of both transistor switches, such as the interval $t_3$–$t_4$ of FIGS. 2A–2D, current still flows in the power transformer output winding 20c of power transformer 20 to output terminal 39 of bridge rectifier 36. This current flows in output winding 20c between times $t_3$–$t_4$ in a direction opposite that of the current flow prior to time $t_3$, as illustrated in FIG. 2A. A negative current $i_{c20}$ flows in power transformer output winding 20c between times $t_3$–$t_4$ because the falling output current $i_{20c}$ causes the operating points of the core of power transformer 20 to follow a B–N loop path that induces a negative voltage in the power transformer windings immediately after time $t_3$.

A voltage is therefore induced across power transformer primary winding section 20a by the negative current $i_{20c}$ that is positive at the dotted terminal relative to the undotted terminal, thereby forcing the collector electrode of transistor Q1 sufficiently below ground potential to forward bias the base-collector pn junction of the transistor. A small reverse collector current, not illustrated in FIG. 2B, flows in transistor Q1 between times $t_3$–$t_4$, the current path beginning, for example, at the anode of diode D1 at ground, through the diode in the forward direction, through the base-collector junction of transistor Q1, which is now forward biased, through control winding 30a and primary winding section 20a, through battery 23 back to ground. This reverse collector conduction ceases when the voltage across capacitor 35 has increased in magnitude above the threshold level $V_t$ and forward biases transistor Q2 at time $t_4$.

By using a saturable transformer drive for inverter transistors Q1 and Q2, with current feedback to the saturable transformer from the collectors of the transistors providing the switching action, free-running operation of inverter transistors Q1 and Q2 is provided. Increasing the load current $i_{load}$ or increasing the DC voltage $V_{in}$ results in earlier saturation of the core of saturable transformer 30 and thus an increase in the switching frequency of the inverter. Operation of the inverter during the start-up interval is thus insured. Because relatively large currents flow out of bridge rectifier output terminal 39 to charge the initially uncharged filter capacitor 41, inverter operation at an increased frequency will occur rather than the overload or short-circuiting of the windings of power transformer 20 as may occur in other inverter configurations.

To insure that one of the transistor switches turns on upon initiation of the start-up interval, base current to one of the transistor switches, transistor switch Q1 in FIG. 1, for example, is initially provided from input terminal 22 through an RC circuit comprising a capacitor 28 and a resistor 29. Once transistor Q1 becomes conductive, normal inverter operation and switching commences. Capacitor 28 eventually becomes fully charged. Disruption of inverter steady-state operation by current flowing from resistor 29 to the base of transistor Q1 is avoided. A relatively large valued resistor 31 is coupled across capacitor 28 to discharge the capacitor after deenergization of power supply 10 in order to enable a subsequent restarting of the inverter.

A diode 24 is coupled between input terminal 22 and ground terminal 21, with the cathode of diode 24 coupled to input terminal 22. The function of diode 24 is to protect the inverter transistor against damage in case battery 23 is connected across terminals 21 and 22 in the wrong polarity. A fuse, not illustrated, in series with the battery then blows due to the high current flow produced by the wrong connection. A capacitor 25 is coupled across input terminal 22 and ground and functions to filter out input voltage ripple. A resistor 26 is also coupled between input terminal 22 and ground for the purposes of discharging capacitor 25 upon deenergization of the entire circuit. A capacitor 27 is coupled between terminal 22 and ground in order to provide RFI bypass.

Under no-load operation, when load current $i_{load}$ is zero, inverter power supply 10 stops operating and transistor switches Q1 and Q2 cease switching action. To prevent a small magnetizing current from flowing in control windings 30a and 30b and thereby exciting drive winding 30c into high frequency parasitic oscillation and to prevent high frequency unsaturated conduction of transistors Q1 and Q2, a resistor 32 and a resistor 33 are series coupled across drive winding 30c, with the junction of the two resistors being coupled to ground. Resistors 32 and 33 damp out parasitic oscillations of drive winding 30c under no-load power supply operating conditions.

An exemplary construction of power transformer 20 is a double E-core forming two windows; center leg cross-section is ⅜ inch by ⅜ inch, each outer leg cross-section 3/16 inch by ⅜ inch, each window of ¾ inch length and a buildup of 5/16 inch. The material of core 120 is a ferrite similar to RCA 540 ferrite manufactured by RCA Corporation, Indianapolis, IN and used as the flyback transformer core material in the RCA Corporation CTC-85 color television receiver. Primary windings 20a and 20b, each ten turns of Litz conductor wire, bifilar wound and appropriately brought out to form a center tap connection. Each conductor wire formed of 60 strands of #36, polyurethane insulated, solderable, copper magnet wire. Output supply winding 20c, 125 turns of #26, polyurethane insulated, solderable, copper magnet wire. Primary windings 20a, 20b and output winding 20c concentrically wound around center leg of core 120, with each winding 20a, 20b, 20c having a travel length of ⅝ inch, with output windng 20c wound over the bifilar wound primary windings 20a and 20b and separated by one layer of thermosetting glass tape, such as 3M #29 tape manufactured by Minnesota Mining & Manufacturing Company, St. Paul, MN.

An exemplary construction of saturable transformer 30 is a toroidal core having an OD of 0.375 inch, an ID of 0.187 inch and a thickness of 0.055 inch. The material of core 130 is a ferrite of grade similar to that of Ferroxcube 3E2A, manufactured by Ferroxcube Corporation, Saugerties, NY. Control windings 30a and 30b, each one turn of #22, PVC insulated, copper hookup wire. Drive winding 30c, twelve turns of #26, polyurethane insulated, solderable, copper magnet wire.

What is claimed is:

1. A push-pull inverter power supply, comprising:
   a power transformer having a plurality of windings including a primary winding and a supply winding;
   first and second transistor switches coupled to said primary winding in a push-pull arrangement;
   a saturable transformer having a control winding and having a drive winding coupled to a control electrode of each one of said first and second transistor switches to alternately apply forward drive to each switch, said saturable transformer control winding being supplied with a control current that reaches a magnitude that magnetically saturates the core of said saturable transformer to remove said forward drive from each transistor switch for developing an alternating polarity output voltage across said power transformer supply winding; and
   a capacitance coupled to said saturable transformer drive winding in such a manner that the voltage across said capacitance, upon the attainment of said control current magnitude, commences a resonant oscillation of a frequency sufficiently low so as to enable said capacitance to supply said drive winding with a magnetizing current that maintains saturation of said core beyond the cessation of forward collector current in the transistor switch subject to the forward drive removal.

2. A power supply according to claim 1 wherein said control winding is coupled in the series path of the collector currents of said first and second transistor switches.

3. A power supply according to claim 1 or 2 including an inductance series coupled with said capacitance across said drive winding and forming a resonant circuit with said capacitance which exhibits resonance at said frequency upon magnetic saturation of said core.

4. A circuit according to claim 3 wherein said power transformer primary winding and said saturable transformer control winding each comprises two winding sections, each of the two transistor switches, when conducting, applying said DC voltage across the series arrangement of a respective power transformer primary winding section and a respective saturable transformer control winding section.

5. A power supply according to claim 4 including first and second diodes series coupled across the base electrode terminals of said first and second transistor switches, one of the anode and cathode electrodes of one diode being coupled to the same type electrode of the other diode.

6. A push-pull inverter with saturable transformer control circuitry, comprising:
   a power transformer having a plurality of windings including a primary winding and a supply winding;
   first and second transistor switches coupled to said primary winding in a push-pull arrangement;
   a saturable transformer having a control winding and having a drive winding coupled to a control electrode of each one of said first and second transistor switches to alternately apply forward drive to each switch, said saturable transformer control winding being supplied with a control current that magnetically saturates the core of said saturable transformer to remove forward drive from each transistor switch for developing an alternating polarity output voltage across said power transformer supply winding;
   an inductance; and
   a capacitance coupled to said inductance and to said saturable transformer drive winding, said capacitance and inductance forming a resonant circuit after said core magnetically saturates for supply said drive winding with a resonant current that maintains the saturable transformer core in magnetic saturation throughout the collector current fall time of the transistor switch subject to the forward drive removal to preclude simultaneous conduction of the two transistor switches.

* * * * *

UNITED STATES PATENT AND TRADEMARK OFFICE
CERTIFICATE OF CORRECTION

PATENT NO. : 4,334,267
DATED : June 8, 1982
INVENTOR(S) : Sandor Miko

It is certified that error appears in the above—identified patent and that said Letters Patent is hereby corrected as shown below:

COLUMN 12, LINE 48:

that portion reading "supply"

should read -- supplying --

*Signed and Sealed this*

*Twenty-fifth* Day of *January 1983*

[SEAL]

*Attest:*

*Attesting Officer*

GERALD J. MOSSINGHOFF

*Commissioner of Patents and Trademarks*